United States Patent

Presser

[15] 3,693,118

[45] Sept. 19, 1972

[54] VARIABLE TUNING ARRANGEMENT FOR A STRIP TRANSMISSION LINE CIRCUIT

[72] Inventor: Adolph Presser, Kendall Park, N.J.

[73] Assignee: RCA Corporation

[22] Filed: Dec. 9, 1971

[21] Appl. No.: 206,390

[52] U.S. Cl. ................331/107 G, 331/96, 333/84 M

[51] Int. Cl. ................................................H03b 7/14

[58] Field of Search........333/84 M, 84; 331/107, 99, 331/96

[56] References Cited

UNITED STATES PATENTS

| | | | |
|---|---|---|---|
| 3,210,697 | 10/1965 | Comstock | 333/84 M |
| 3,639,857 | 7/1970 | Okoshi et al. | 333/84 M |

*Primary Examiner*—John Kominski
*Attorney*—Edward J. Norton

[57] ABSTRACT

A tuning arrangement is provided for a strip transmission line circuit of the type including a ground plane or conductor and a narrow conductor spaced from the ground plane by a dielectric substrate. A portion of the ground plane immediately below and spaced from the narrow conductor by the substrate is removed, leaving a portion of the dielectric substrate surface opposite that which supports the narrow conductor exposed. An element having a conductive surface tunes the circuit by providing selected amounts of the conductive material at the exposed, opposite surface of the substrate.

5 Claims, 5 Drawing Figures

VARIABLE TUNING ARRANGEMENT FOR A STRIP TRANSMISSION LINE CIRCUIT

BACKGROUND OF THE INVENTION

This invention relates to a tuning arrangement for a strip transmission line circuit, and more particularly to a tuning arrangement for a strip transmission line circuit in a hermetically sealed package.

As in other areas of electronics, there is a need in the microwave industry for low cost and compact devices. Strip transmission lines provide the low cost and compact construction desired. A particular form of strip transmission line referred to as "microstrip" is formed by a single planar sheet of dielectric material with a narrow strip-like conductor on one of the broad surfaces of the substrate and a broad ground plane or conductor on the opposite surface of the substrate.

In the production of a microwave circuit with the microstrip transmission line configuration, one side of the dielectric sheet is covered with a conductive material layer. The opposite surface has one or more narrow conductive strips arranged to provide the desired circuitry. Active devices such as a transistor, an avalanche diode or a transferred electron device may be mounted onto the substrate or its supporting ground conductor and appropriately connected to the conductive strips to form a desired microwave, active circuit device.

It is commonly necessary to change (tune) the frequency response of these active devices or that of passive devices such as filters and transformers. The tuning is frequently done by (a) changing the length of a reactance stub in steps by means of sand blasting, soldering, etc., or (b) attaching tuning screws above or below the stub, thus altering the field configuration and thus the reactance. The first approach is of limited use because of the stepped and irreversible character of the tuning and is commonly used for trimming purposes only. The second method can be made continuous but results usually only in small reactance changes if provided below the strip-like conductor. If arranged above the stub, hermetic sealing if required poses a problem.

SUMMARY OF THE INVENTION

Briefly, an improved microstrip transmission line tuner is described. A portion of the ground planar conductor immediately below and spaced from the narrow strip-like conductor by the substrate is removed. Tuning is achieved by means of a member having a conductive surface slidably mounted to provide selected amounts of the conductive surface thereof in the area from which the ground conductor has been removed.

DESCRIPTION OF THE DRAWING

A more detailed description follows in conjunction with the following drawings wherein.

DETAILED DESCRIPTION

Figures 1, 2, 3, 4, 5:
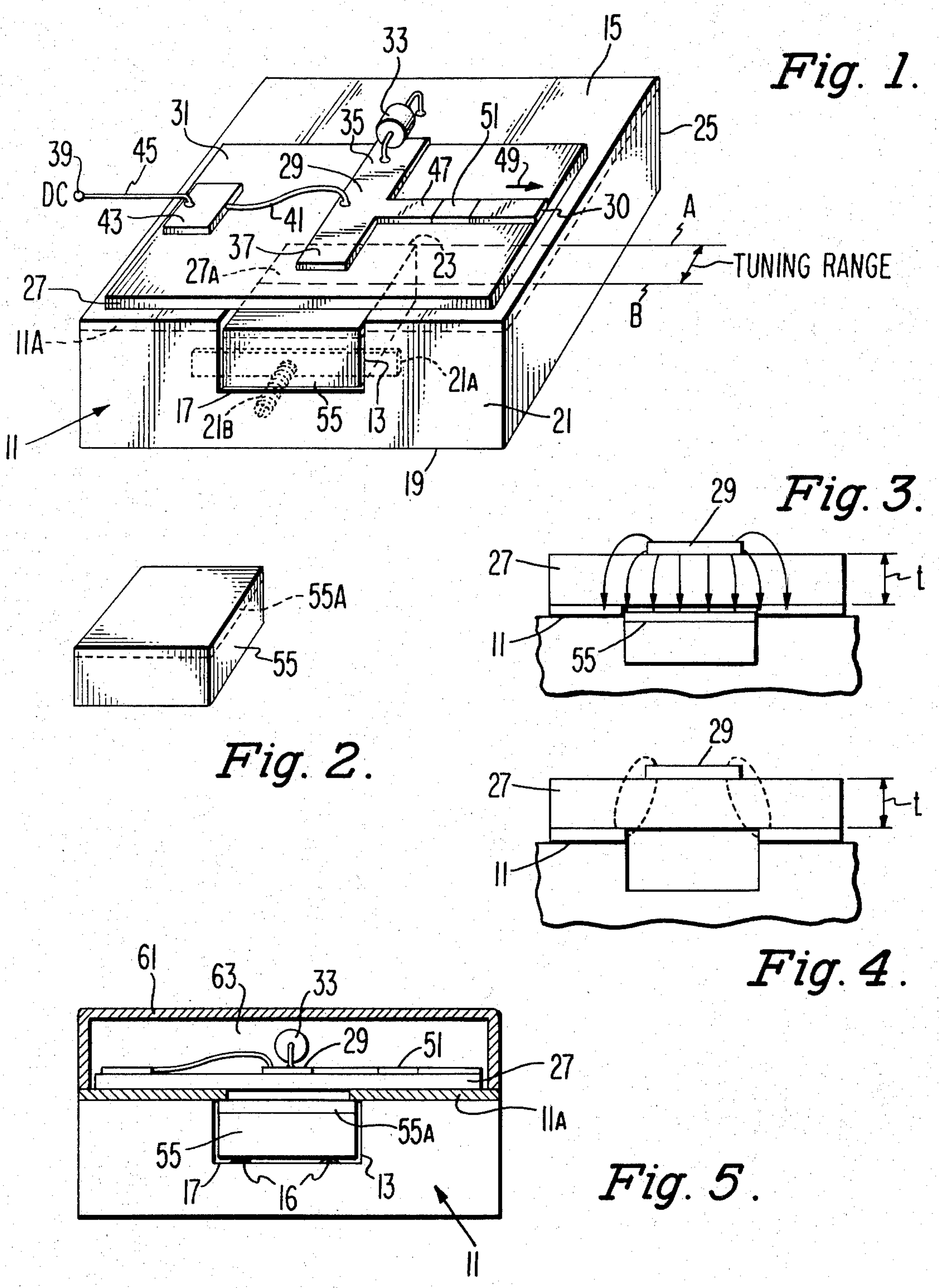
FIG. 1 is a perspective view of the tuning arrangement for a microstrip circuit.
FIG. 2 is a perspective view of the tuning member shown in FIG. 1.
FIG. 3 is a partial cross-sectional view of FIG. 1 illustrating the electric field lines when the tuning member is in the A position.
FIG. 4 is a partial cross-sectional view of FIG. 1, illustrating the field lines when the tuning member is in the B position.
FIG. 5 is a cross-sectional view of the embodiment of FIG. 1 in a hermetically sealed package.

Referring to FIG. 1, there is illustrated by way of example a transferred electron oscillator in a microstrip circuit. The circuit comprises a metal bar 11 having a channel 13 cut therein which extends from top surface 15 to a region 17 approximately half the distance to the bottom surface 19. The region 17 of bar 11 is a sufficient distance from surface 15 so as to be out of the strong electromagnetic field associated with a microstrip line located on surface 15. The channel 13 extends from side surface 21 to a region 23 located between side surface 21 and opposite side surface 25. A layer or substrate 27 of dielectric material is placed on the top surface 15 of the metal bar 11 with a region 27A extending over channel 13. A microstrip transmission line circuit is formed by a T-shaped narrow strip conductor 29 located on surface 31 of dielectric substrate 27. One end 35 of narrow strip-like conductor 29 is coupled to one terminal of a transferred electron device 33. The other terminal end of the device 33 is coupled to top surface 15 of metal bar 11. The end 37 of narrow conductor 29 that is directly opposite end 35 extends above the region 27A of the substrate 27 and above the channel 13 Between ends 35 and 37 is the crossed portion 47 of conductor 29.

Proper d.c. bias for the device 33 is provided by a bias source not shown coupled at terminal 39 which, in turn, is coupled to device 33 by means of narrow strip-like conductor 29, biasing wire 41, conductive pad 43, and coupling wire 45. Upon the application of proper d.c. bias applied at terminal 39, the device 33 oscillates, and microwave signals are coupled along conductor section 47 in the direction of arrow 49. The signals generated are r.f. (radio frequency) signals at microwave frequencies and, by the provision of a capacitor or dielectric material 51 along narrow strip 47, the d.c. bias supplied at terminal 39 is blocked from the output terminal 30. For a further description of the operation and construction of such devices, attention is directed to "Recent Advances in Solid State Microwave Generators," pages 44–86, in *Advances in Microwaves*, Volume 2, published in 1967 by the Academic Press.

Referring to FIG. 2, there is illustrated a rectangular block member or tuner 55 dimensioned just slightly smaller than the space dimensions of the channel 13 in metal bar 11 so as to permit the member to slidably pass along the channel 13. The member 55 is entirely of metal, conductive material. The rectangular member 55 when placed in the channel 13 can be moved from position A to the position B. At position A, the metal material of member 55 substantially occludes the exposed region 27A of the substrate 27 and provides a ground conductor spaced from the narrow conductor 29 by the substrate 27. At position B, the metal member 55 does not cover any of the region 27A of the substrate 27 below conductor 29. By moving member 55 between positions A and B, a relatively wide range of tuning of the device 33 and the microstrip circuit 29 is provided. The member 55 may be held and moved by fixing a plate (indicates by dashed lines 21A) having a threaded aperture to the surface 21 of bar 11 with the plate 21A extending across channel 13. A threaded screw 21B is threaded to the plate with one end of the screw fixed with a bearing to member 55 so that by turning the screw 21B the member 55 slides along the channel.

Referring to FIG. 3, there is illustrated the field configuration when the metal member 55 is in the position A. The field configuration is like that of a simple microstrip line with strong fields between conductor 29 and the member 55.

FIG. 4 shows the field configuration when the metal member 55 is in the position B. In the position B with no metal material in the strong field region under conductor 29, the fields are in the fringed area. Because of the fields being in the fringed areas as shown, this second configuration when the metal member is in position B presents a higher characteristic impedance than that when the metal member 55 is in the position A. The stub at end 37 as viewed from the device side is effectively electrically shortened. If the removed portion of the ground plane is selectively restored by moving the metallic member 55, a variable reactance element is obtained at end 37. As stated, the device 33 may be, for example, a transferred electron oscillator (TEO) sometimes referred to by some as a Gunn oscillator. In a TEO arrangement constructed in the manner described, the frequency of the oscillator was smoothly and continuously tuned over the 10 GHz to 11 GHz frequency range with a movement of member 55 of 0.080 inches. The dielectric constant of the substrate was 10 and the thickness, *t*, of the dielectric material 27 was 0.015 inch.

In the arrangement described above, the bar 11 was stated to be all of conductive material. Similarly, the occluding material was the bar 55 of metal material. This arrangement may be altered, for example, by making the bar 11 dielectric material with the surface 15 adjacent the substrate 27 having a conductive layer 11A. The boundary of channel 13 would in this case be all dielectric material. The bar 55 could be a dielectric bar having a layer 55A of conductive material on that surface which will be adjacent to dielectric layer 27. Tuning is provided by providing more or less of the conductive layer 55A below region 27A of the substrate 27. In this arrangement it is desirable that some means be provided in which conductive layer 55A is in continuous contact with layer 11A. One way of accomplishing this is shown in FIG. 5 where the conductive layer 11A overlaps the channel 13 and a pair of bent metal springs 16 are fixed to the region 17 of bar 11 to press layer 55A up against layer 11A.

Referring to FIG. 5, there is illustrated how this last mentioned arrangement is used for a hermetically sealed microstrip circuit. The bar 11 of dielectric material having conductive material 11A on its one surface 15 is presented in FIG. 5. Adjacent conductive surface 11A is the dielectric substrate 27 and conductor 29. An enclosure wall 61 extends from the conductive surface 11A of bar 11 and above the narrow conductor 29 and substrate 27 as shown in FIG. 5. Tuning by the dielectric member 55 having conductive layer 55A would not injure the hermetic seal of the enclosure since the dielectric layer 27 would prevent the ambient from reaching the enclosure 63.

What is claimed is:

1. In a transmission line assembly of the type having a dielectric substrate with a ground planar conductor on one surface and a narrow strip-like conductor on the opposite surface of the substrate, the improvement whereby a tuning means is provided for said assembly comprising: said ground planar conductor having an aperture therethrough to expose an area of the surface of said substrate directly opposite that which supports said narrow strip-like conductor, a member having a conductive surface slidably mounted relative to said aperture to tune by providing more or less of said conductive surface at said exposed, opposite surface of said substrate.

2. In combination:

a block of conductive material having a channel therein extending from a side and a top surface of said block, a substrate of dielectric material adjacent to said top surface of said block and extending over said channel, a narrow strip-like conductor adjacent the opposite surface of said substrate relative to said block with a portion of said narrow strip-like conductor extending above said channel, a member having a conductive surface dimensioned and arranged to be slidably positioned along said channel and to present more or less of said conductive surface spaced from said narrow conductor by said substrate to provide tuning.

3. The combination claimed in claim 2 including an active device coupled between said block and said narrow conductor at an end remote to the extending portion.

4. The combination claimed in claim 3 wherein said device is a transferred electron oscillator.

5. In a sealed transmission line circuit assembly, said transmission line being formed by a dielectric substrate having a broad conductor on one surface of said substrate and at least one narrow strip-like conductor on the opposite surface of said substrate, the broad conductor being fixed to a wall of an enclosure providing said seal, the improvement whereby an adjustable tuning means is provided for said assembly comprising, said broad conductor having an opening therethrough to expose an area of the surface of said substrate opposite that which supports said narrow conductor, said substrate maintaining isolation between the inner area of said enclosure and the outside thereof, and a member having a conductive surface slidably mounted within said opening to tune said assembly by changing the extent of said exposed area.

* * * * *